(12) United States Patent
Fuller et al.

(10) Patent No.: US 6,174,787 B1
(45) Date of Patent: Jan. 16, 2001

(54) SILICON CORNER ROUNDING BY ION IMPLANTATION FOR SHALLOW TRENCH ISOLATION

(75) Inventors: Robert Fuller, Mechanicsville; Jonathan Philip Davis, Glen Allen; Michael Rennie, Richmond, all of VA (US)

(73) Assignees: White Oak Semiconductor Partnership, Sandston, VA (US); Infineon Technologies North America Corp., San Jose, CA (US)

( * ) Notice: Under 35 U.S.C. 154(b), the term of this patent shall be extended for 0 days.

(21) Appl. No.: 09/476,725

(22) Filed: Dec. 30, 1999

(51) Int. Cl.[7] .................................................. H01L 21/76
(52) U.S. Cl. ............................................ 438/440; 438/412
(58) Field of Search .................................. 438/440, 424, 438/412

(56) References Cited

U.S. PATENT DOCUMENTS

| 5,258,332 | | 11/1993 | Horioka et al. | 437/228 |
|---|---|---|---|---|
| 5,643,822 | * | 7/1997 | Furukawa et al. | 438/431 |
| 5,780,346 | * | 7/1998 | Arghavani et al. | 438/296 |
| 5,843,846 | * | 12/1998 | Nguyen et al. | 438/713 |
| 5,858,857 | | 1/1999 | Ho | 438/424 |
| 5,861,104 | | 1/1999 | Omid-Zohoor | 216/84 |
| 5,910,018 | | 6/1999 | Jang | 438/425 |
| 5,915,195 | | 6/1999 | Fulford Jr, et al. | 438/524 |
| 5,940,718 | * | 8/1999 | Ibok et al. | 438/440 |
| 5,945,724 | | 8/1999 | Parekh et al. | 257/510 |
| 5,956,598 | | 9/1999 | Huang et al. | 438/424 |
| 5,976,987 | | 11/1999 | Harvey et al. | 438/734 |
| 6,033,968 | * | 3/2000 | Sung | 438/424 |

* cited by examiner

Primary Examiner—Charles Bowers
Assistant Examiner—David S Blum
(74) Attorney, Agent, or Firm—Stanton C. Braden

(57) ABSTRACT

A method for rounding corners of a silicon substrate, in accordance with the present invention, includes forming a plateau on a silicon substrate having corners at edges of the plateau. A mask is formed on a top surface of the plateau, which is recessed back from vertical edges of the plateau to provide exposed horizontal portions. Fluorine or Argon dopants are implanted at the corners and on the exposed portions, and the substrate is oxidized such that the corners become rounded providing a gradual transition at the edges of the plateau.

20 Claims, 6 Drawing Sheets

SILICON CORNER ROUNDING BY ION IMPLANTATION FOR SHALLOW TRENCH ISOLATION

BACKGROUND

1. Technical Field

This disclosure relates to semiconductor fabrication and more particularly, to a method for rounding corners of silicon by employing an implantation process.

2. Description of the Related Art

Field effect transistors (FET) for semiconductor devices typically include a doped active area 10 where a channel 14 forms between a source 8 and a drain 11 of the FET as shown in FIGS. 1A and 1B. When a gate electrode 12 is activated under proper conditions, conduction of current between source and drain occurs through a channel 14 (shown in phantom lines) below the gate electrode 12. Isolation regions 16 are adjacent to the active area 10.

Sharp corners 18 at the edge of the active regions 10 formed by trenches 22 which provide a location for shallow trench isolation regions 16 can cause a low threshold voltage for the transistor. This results in the transistor being switched on at lower, undesirable voltages and or current leakage through the transistor. Corners 18 also promote gate oxide defects, which may result in voltage breakage of a gate oxide layer 24. These parasitic leakages due to the sharp corners reduce FET performance and lead to errors in data or malfunctions in the FET.

Therefore, a need exists for a method for rounding sharp corners in an active area region. A further need exists for a method for forming the rounded corners by employing ion implantation.

SUMMARY OF THE INVENTION

A method for rounding corners of a silicon substrate, in accordance with the present invention, forming a plateau on a silicon substrate having corners at edges thereof, forming a mask on a top surface of the plateau, recessing the mask back from vertical edges of the plateau to provide horizontal exposed portions, implanting one of Fluorine and Argon dopants at the corners and on the exposed portions and oxidizing the substrate such that the corners become rounded providing a gradual transition at the edges of the plateau.

A method for rounding corners of an active area plateau for a field effect transistor includes providing a silicon substrate, the silicon having a planar surface, patterning the substrate to form trenches therein such that a plateau is formed for an active area of a transistor, the plateau including corners at edges of the plateau and at base of the plateau, recessing an etch mask back from vertical edges of the plateau to provide exposed portions, implanting one of Fluorine and Argon dopants at the corners of the plateau and at corners formed at the base of the plateau, and oxidizing the substrate such that the corners of the plateau and the corners of the base of the plateau become rounded providing a gradual transition at the edges of the plateau and at the corners of the base of the plateau.

In alternate methods, the step of forming a plateau may include the steps of providing the silicon substrate, the silicon substrate having a planar surface, patterning the mask on the surface and etching trenches into the substrate to form the plateau. The step of implanting one of Fluorine and Argon dopants at the corners may include the step of implanting the one of Fluorine and Argon dopants at a dose of between about $1 \times 10^{14}$ ions/cm$^2$ and about $1 \times 10^{16}$ ions/cm$^2$. The step of implanting one of Fluorine and Argon dopants at the corners may include the step of implanting the one of Fluorine and Argon dopants at an energy of about 10 to 50 keV. The step of oxidizing may include the step of exposing the substrate to oxygen or steam at a temperature of between about 900 and about 1100 degrees C. The step of oxidizing may include forming an oxide layer between about 5 nm and 20 nm in thickness. The mask may be recessed back by between about 5 nm and about 10 nm.

A method for masking source and drain regions during implantation, in accordance with the present invention includes the steps of providing a silicon substrate, the silicon having a planar surface, patterning a mask on the substrate over a first region, implanting a second region in the substrate with dopants of a first type, implanting one of Fluorine and Argon into the second region, removing the mask from the first region, oxidizing the substrate such that the Fluorine and Argon promote an oxide layer to form over the second region which is thicker than the oxide layer over the first region and implanting the first region in the substrate with dopants of a second type such that dopants of the second type have an energy sufficient to penetrate the oxide layer over the first region but have insufficient energy to penetrate the oxide layer over the second region.

In other methods, the step of implanting one of Fluorine and Argon may include the step of implanting the one of Fluorine and Argon at a dose of between about $1 \times 10^{14}$ ions/cm$^2$ and about $1 \times 10^{16}$ ions/cm$^2$. The step of implanting one of Fluorine and Argon may include the step of implanting the one of Fluorine and Argon dopants at an energy of about 10 to 50 keV. The step of oxidizing may include the step of exposing the substrate to oxygen or steam at a temperature of between about 900 and about 1100 degrees C. The first dopant type may include P dopants, and the second dopant type may include N dopants.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication, and, in particular, to a method for rounding corners of an active area region. A mask is employed to etch a substrate, preferably a silicon substrate, to form trenches. This results in a portion of the substrate extending from the floor of the trenches. This portion may be employed as an active area for a transistor device. The portion includes sharp corners as described above. The present invention employs a doping procedure to dope these corners. The corners and other regions of the portion are then oxidized. The oxidation process causes the corners to be rounded avoiding the problems of low threshold voltage, current leakage and gate defects in the oxide layer.

The present invention will now be described in greater detail with reference to the FIGS. which illustratively show the invention employed on an active area region of a field effect transistor. The present invention should not be construed as limited by the illustrative example. Instead, the invention may be employed in any semiconductor device where rounded corners are desirable.

Figure 1A:
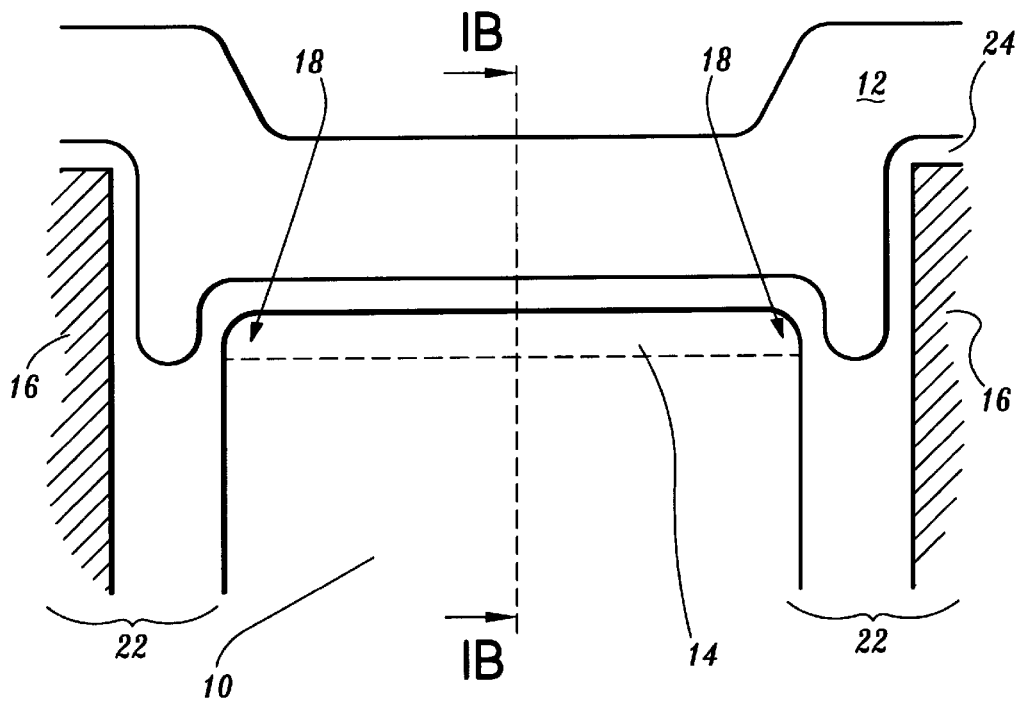
FIG. 1A is a cross-sectional view of a transistor in accordance with the prior art showing sharp corners on a plateau formed on a substrate.
Figure 1B:
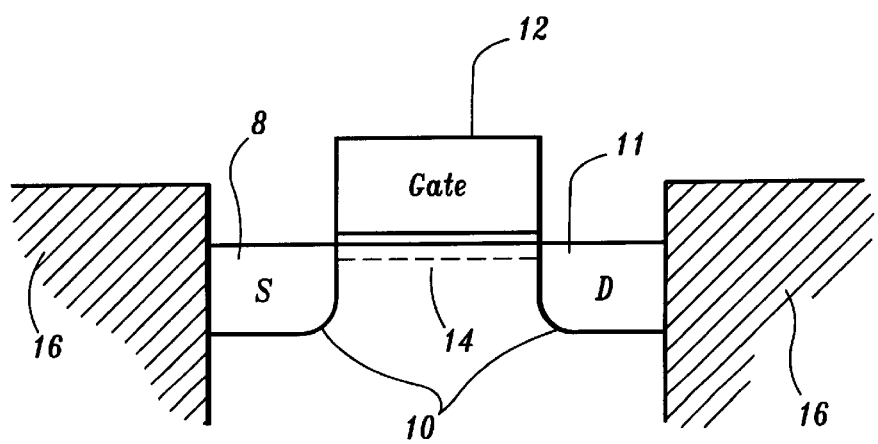
FIG. 1B is a cross-sectional view of the transistor of FIG. 1A taken at section line 1B—1B in accordance with the prior art.
Figure 2:
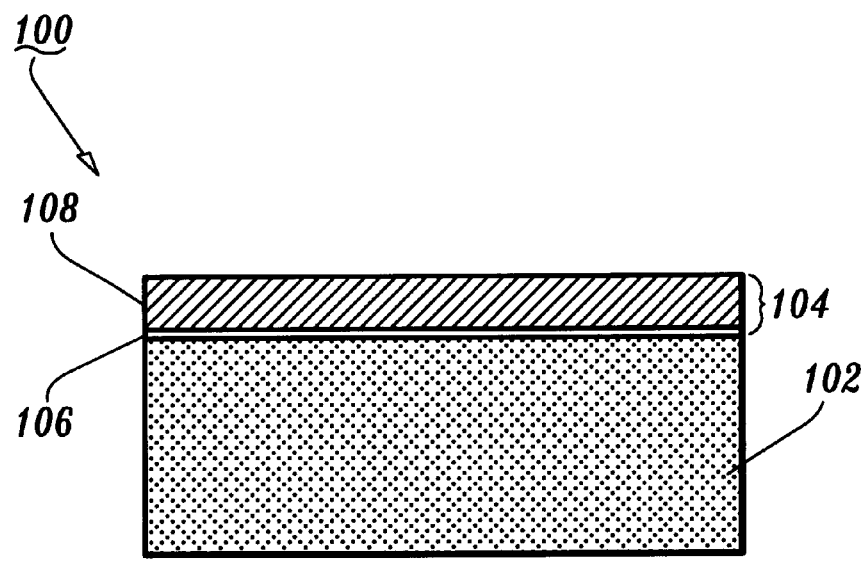
FIG. 2 is a cross-sectional view of a semiconductor device showing an etch mask formed thereon in accordance with the present invention.

Referring now in specific detail to the drawings in which like reference numerals identify similar or identical elements throughout the several views, and initially to FIG. 2, a substrate 102 is shown for a device 100. Device 100 may include a memory device such as, for example, a dynamic random access memory (DRAM) or a static random access memory (SRAM) or similar device. Device 100 may also include a processor, embedded memory, an application specific integrated circuit (ASIC) or other semiconductor device. Substrate 102 preferably includes a monocrystalline silicon substrate, although other substrate material or structures may also be employed.

An etch mask or hard mask 104 is employed to pattern substrate 102. Etch mask 104 may include multiple layers, such as, for example, a pad oxide layer 106 and a pad nitride layer 108. Other layers may be employed for etch mask 104 as well. The multiple layers are preferably selectively etched relative to one another and substrate 102 or underlying layers. This provides the ability to remove each layer with minimal damage to underlying layers.

Figure 3:
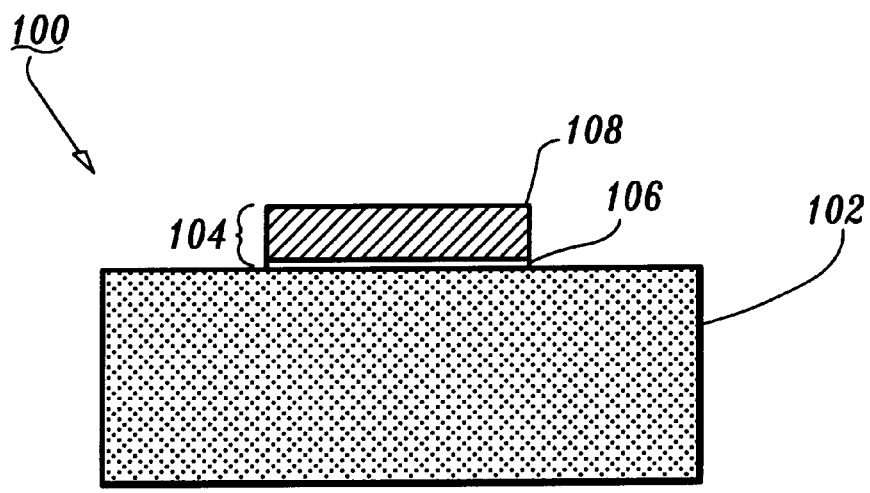
FIG. 3 is a cross-sectional view of the semiconductor device of FIG. 2 showing the etch mask patterned in accordance with the present invention.

Referring to FIG. 3, after forming etch mask 104, etch mask 104 is patterned by employing lithographic patterning techniques known to those skilled in the art. Such techniques may include employing a photoresist to appropriately pattern etch mask 104.

Figure 4:
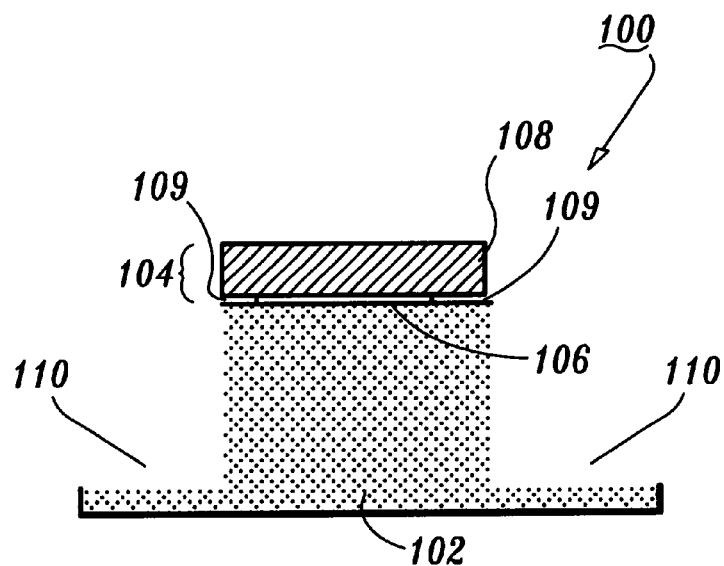
FIG. 4 is a cross-sectional view of the semiconductor device of FIG. 3 showing trenches etched in a substrate in accordance with the present invention.

Referring to FIG. 4, etch mask 104 is employed to pattern substrate 102. An anisotropic etching process is preferably employed to form trenches 110 in substrate 102. A reactive ion etch (RIE) or a plasma etch may be employed to etch substrate 102. The plasma etch may preferably employ plasmas of gases, such as, $CF_4$, $CHF_3$, $O_2$, Ar or other compounds or elements. In the example, as a result of the etching process, pad oxide 106 is etched more than pad nitride 108. This is due to the greater selectivity of the etch process to nitride material of pad nitride 108. Recesses 109 are formed by the etch process.

Figure 5:
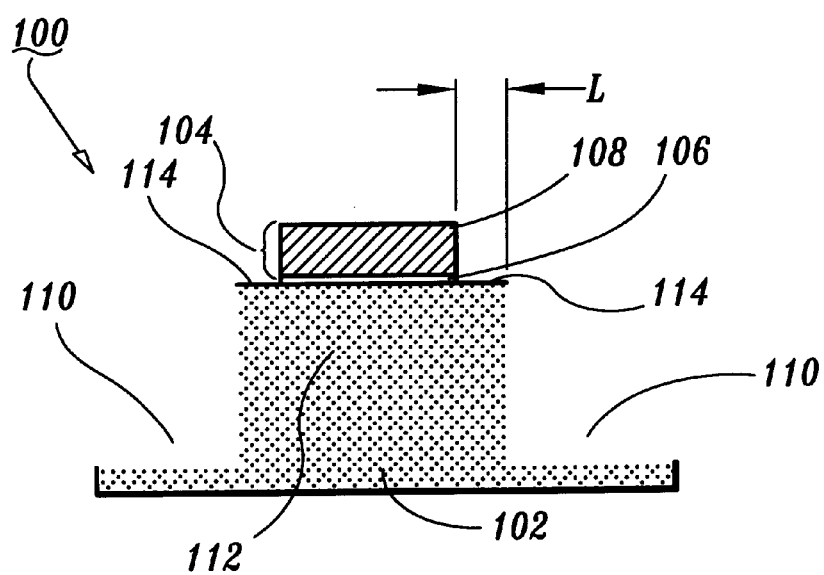
FIG. 5 is a cross-sectional view of the semiconductor device of FIG. 4 showing the etch mask recessed back to expose a top portion of a plateau of the substrate in accordance with the present invention.

Referring to FIG. 5, etch mask 104 is recessed back from edges of a plateau 112 of substrate 102. Etch mask 104 is preferably etched back to expose a top portion 114 of plateau 112. In the example, pad nitride 108 is etched back to pad oxide 106 or both layers are etched back to expose top portion 114. In a preferred embodiment, a wet etch process is employed to wet etch back etch mask 104. If oxide and/or nitride are employed for etch mask 104, the wet etch process may include a mixture of 4% HF and 96% ethylene glycol at about 80 degrees C for about 5 minutes. Other etching processes are also contemplated. Top portion 114 includes a recessed length L. L is preferably between about 5 nm and about 10 nm. L affects the radius for corner rounding.

Figure 6:
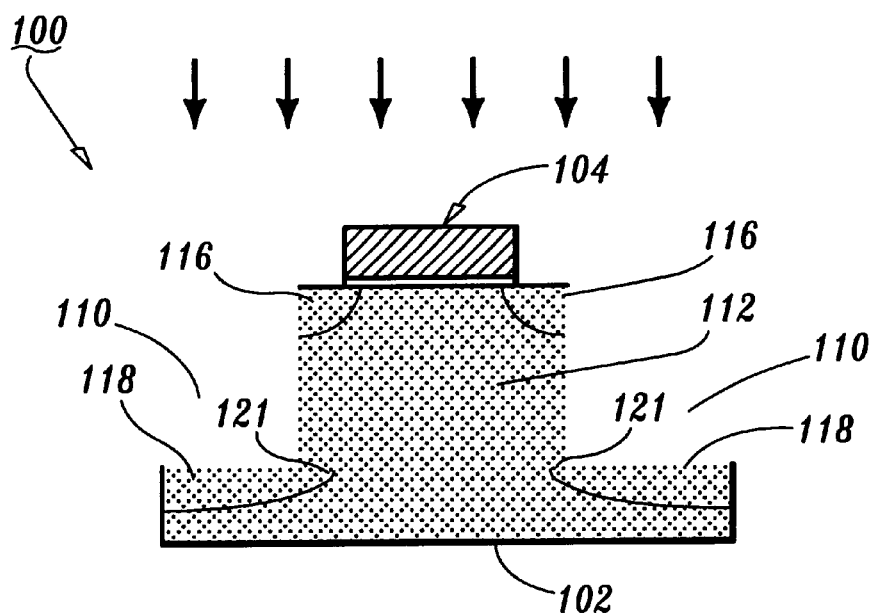
FIG. 6 is a cross-sectional view of the semiconductor device of FIG. 5 showing dopants implanted in accordance with the present invention.

Referring to FIG. 6, etch mask 104 is employed again as a mask. An implantation of atoms is performed to prepare exposed surfaces of substrate 102 for oxidation in later steps. In one embodiment, Fluorine or Argon ions are implanted in substrate 102 at exposed areas to form implanted regions 116 and 118. Implanted regions 116 include corners of plateau 112 and lower surfaces of trenches 110, e.g., at a base of plateau 112 to round corners 121 adjacent to region 118. If Fluorine or Argon atoms are implanted in substrate 102, a dose of about $1\times10^{14}$ ions/cm$^2$ and about $1\times10^{16}$ ions/cm$^2$ at an energy of about 10 to 50 keV is preferred. Implantation energy and dose should be sufficient to implant to a depth of about 20 nm, although other implantation depths may be employed. In this way a sufficient portion of the corners of plateau 112 is covered to reduce the sharp corners as will be described below. It is preferable to implant dopants at an angle substantially perpendicular to a horizontal surface of substrate 102 and plateau 112. In this way, dopants are advantageously implanted at corners in regions 116 and 118.

Figure 7:
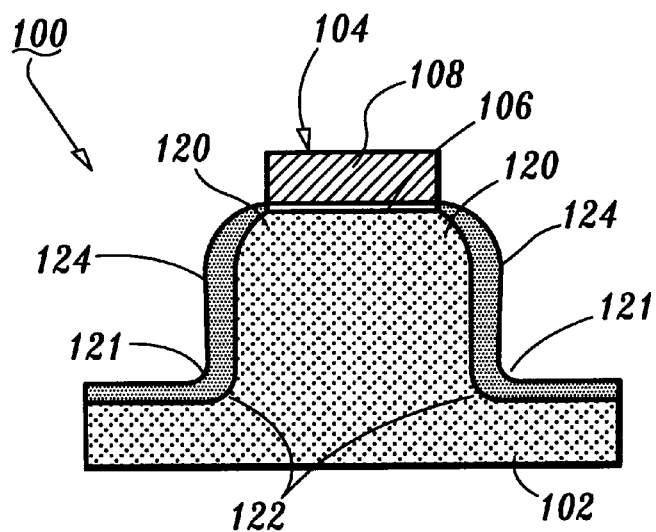
FIG. 7 is a cross-sectional view of the semiconductor device of FIG. 6 showing an oxide layer formed such that the process rounds the corners of the plateau in accordance with the present invention.

Referring to FIG. 7, an oxidation of the exposed areas of substrate 102 is performed. The oxidation grows thicker in implanted regions 116 and 118.

Advantageously, this promotes a rounding of corners 120 and 122. In one embodiment, the oxidation process includes high temperature oxidation of substrate 102. This includes exposing the surface of substrate 102 to oxygen or steam at a temperature of between about 900 and about 1100 degrees C. The oxidation may be performed in a furnace or in a Rapid Thermal Oxidation (RTO) tool. An oxide layer 124 is formed. Oxide layer 124 is preferable between about 5 nm and about 20 nm. In one embodiment, oxide layer 124 is employed with pad oxide 106 to form a continuos gate oxide for a field effect transistor.

Figure 8A:
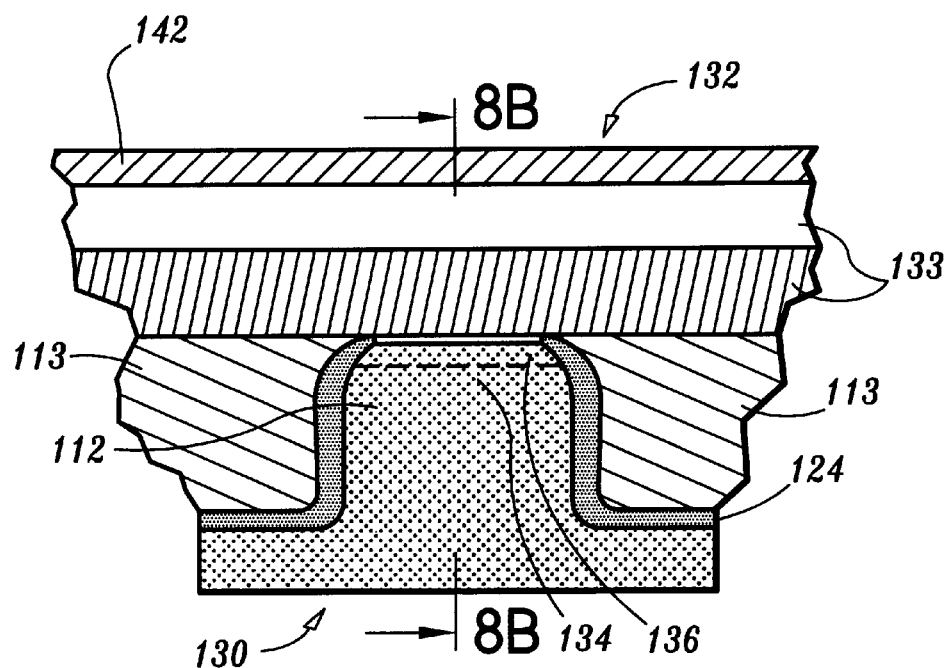
FIG. 8A is a cross-sectional view a transistor formed in accordance with the present invention.
Figure 8B:
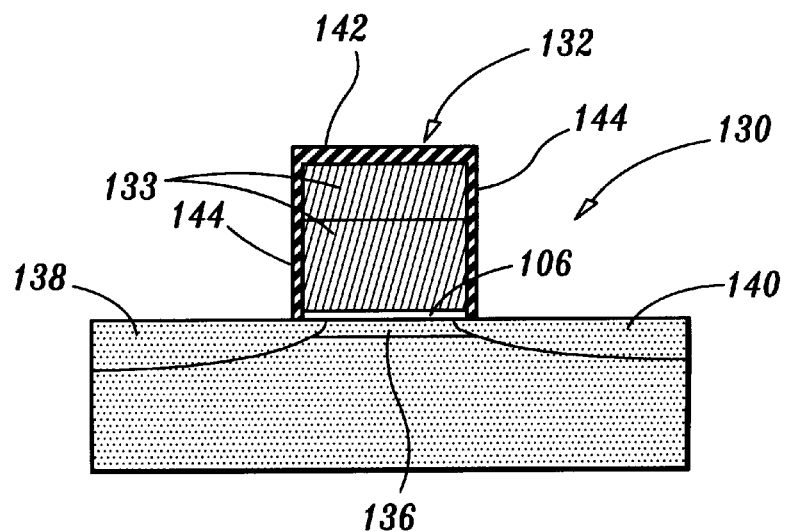
FIG. 8B is a cross-sectional view of the transistor of FIG. 8A taken at section line 8B—8B in accordance with the present invention.

Referring to FIGS. 8A and 8B, a field effect transistor 130 is shown in accordance with the present invention. Transistor 130 includes a gate stack 132 that includes conductive material 133 for forming a gate. Plateau 112 forms an active area 134 with a channel 136. Plateau 112 has shallow trench isolation regions 113 adjacent thereto. Channel 136 conducts when conductive material 133 of gate stack 132 is activated to create an electrical field therebelow. Current flows between source diffusion region 138 and drain diffusion region 140 when the gate is activated. Gate stack 132 preferably includes a dielectric cap layer 142 and spacers 144, which are preferably formed from nitride.

Figure 9:
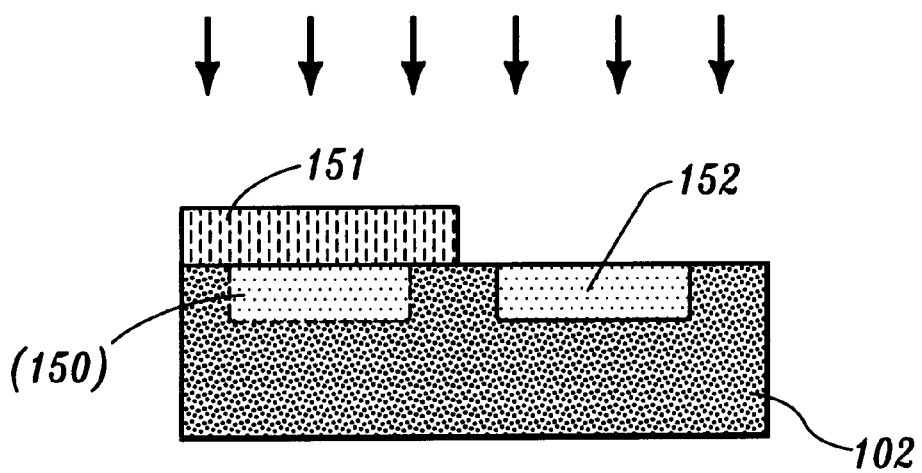
FIG. 9 is a cross-sectional view of a semiconductor device showing an N-channel region masked and a P-channel region exposed to dopant implantation in accordance with the present invention.
Figure 10:
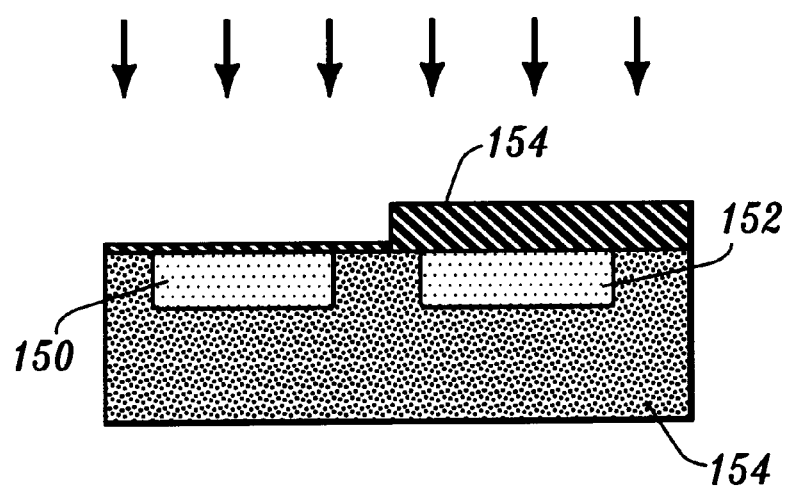
FIG. 10 is a cross-sectional view of the semiconductor device of FIG. 9 showing the N-channel region implanted in accordance with the present invention.

Referring to FIGS. 9 and 10, the present invention may be employed in the formation of other components for semiconductor devices, as well. For example, in one embodiment, the present invention could be employed to form a source/drain mask for transistor or other device formation by employing the methods set forth above. N-channel regions 150 (N-channel region 150 is formed in FIG. 10 but is indicated in FIG. 9 with parenthesis and a dashed outline) may be masked by a mask material 151 and P-channel regions 152 implanted with, say, Boron, followed by Fluorine or Argon (or other material in accordance with the invention). Resist or mask 151 of the N-channel regions 150 is then stripped off and the device is oxidized to form oxidation layer 154. A thicker oxide 155 grows over the P-channel regions 152 due to the F/Ar implants. The N-channel region 150 would than be doped with say, Arsenic. The doping energy would be selected such that the Arsenic penetrates the N-channels 150 without penetrating the P-channels 152 due to the greater oxide thickness. Other materials and configurations may be employed to practice the present invention.

Having described preferred embodiments silicon corner rounding by ion implantation for shallow trench isolation (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for rounding corners of a silicon substrate, comprising the steps of:
   forming a plateau in a silicon substrate having corners at edges thereof, the plateau being employed to support a gate electrode;
   forming a mask on a top surface of the plateau;
   recessing the mask back from vertical edges of the plateau to provide exposed horizontal portions of the plateau;
   implanting dopants at the corners and on the exposed horizontal portions; and
   oxidizing the substrate to form an oxide layer over the plateau such that the corners of the plateau become rounded providing a gradual transition at the edges of the plateau wherein at least a portion of the oxide layer is employed as a gate oxide for the gate electrode of a transistor.

2. The method as recited in claim 1, wherein the step of forming a plateau includes the steps of:
   providing the silicon substrate, the silicon substrate having a planar surface;
   patterning the mask on the surface; and etching trenches into the substrate to form the plateau.

3. The method as recited in claim 1, wherein the step of implanting dopants includes the step of implanting one of Fluorine and Argon dopants at a dose of between about $1 \times 10^{14}$ ions/cm$^2$ and about $1 \times 10^{16}$ ions/cm$^2$.

4. The method as recited in claim 3, wherein the step of implanting one of Fluorine and Argon includes the step of implanting the one of Fluorine and Argon dopants at an energy of about 10 to about 50 keV.

5. The method as recited in claim 1, wherein the step of oxidizing includes the step of exposing the substrate to oxygen or steam at a temperature of between about 900 and about 1100 degrees C.

6. The method as recited in claim 1, wherein the step of oxidizing includes forming the oxide layer between about 5 nm and 20 nm in thickness.

7. The method as recited in claim 1, wherein the exposed horizontal portions are recessed back between about 5 nm and about 10 nm.

8. A method for rounding corners of an active area plateau for a field effect transistor, comprising the steps of:
   providing a silicon substrate, the silicon substrate having a planar surface;
   patterning the substrate to form trenches therein such that a plateau is formed for an active area of a transistor, the plateau including corners at edges of the plateau and corners at a base of the plateau;
   recessing an etch mask back from vertical edges of the plateau to provide exposed horizontal portions;
   implanting one of Fluorine and Argon dopants at the corners of the plateau and at the corners formed at the base of the plateau; and
   oxidizing the substrate such that the corners of the plateau and the corners of the base of the plateau become rounded providing a gradual transition at the edges of the plateau and at the corners of the base of the plateau.

9. The method as recited in claim 8, wherein the step of implanting one of Fluorine and Argon includes the step of implanting the one of Fluorine and Argon dopants at a dose of between about $1 \times 10^{14}$ ions/cm$^2$ and about $1 \times 10^{16}$ ions/cm$^2$.

10. The method as recited in claim 8, wherein the step of implanting one of Fluorine and Argon includes the step of implanting the one of Fluorine and Argon dopants at an energy of about 10 to 50 keV.

11. The method as recited in claim 8, wherein the step of oxidizing includes the step of exposing the substrate to oxygen or steam at a temperature of between about 900 and about 1100 degrees C.

12. The method as recited in claim 8, wherein the step of oxidizing includes forming an oxide layer between about 5 nm and 20 nm in thickness.

13. The method as recited in claim 8, wherein the step of oxidizing includes forming an oxide layer wherein at least a portion of the oxide layer is employed as a gate oxide for a gate for the transistor.

14. The method as recited in claim 8, wherein the exposed horizontal portions are recessed back between about 5 nm and about 10 nm.

15. A method for masking source and drain diffusion regions during implantation, comprising the steps of:
   providing a silicon substrate, the silicon having a planar surface;
   patterning a mask on the substrate over a first region;
   implanting a second region in the substrate with dopants of a first type;
   implanting one of Fluorine and Argon into the second region;
   removing the mask from the first region;
   oxidizing the substrate such that the Fluorine and Argon promote an oxide layer to form over the second region which is thicker than the oxide layer over the first region; and implanting the first region in the substrate with dopants of a second type such that dopants of the second type have an energy sufficient to penetrate the oxide layer over the first region but have insufficient energy to penetrate the oxide layer over the second region.

16. The method as recited in claim 15, wherein the step of implanting one of Fluorine and Argon includes the step of implanting the one of Fluorine and Argon at a dose of between about $1\times10^{14}$ ions/cm$^2$ and about $1\times10^{16}$ ions/cm$^2$.

17. The method as recited in claim 15, wherein the step of implanting one of Fluorine and Argon includes the step of implanting the one of Fluorine and Argon dopants at an energy of about 10 to 50 keV.

18. The method as recited in claim 15, wherein the step of oxidizing includes the step of exposing the substrate to oxygen or steam at a temperature of between about 900 and about 1100 degrees C.

19. The method as recited in claim 15, wherein the first dopant type includes P dopants.

20. The method as recited in claim 15, wherein the second dopant type includes N dopants.

* * * * *